United States Patent
Verma et al.

(10) Patent No.: US 12,324,168 B2
(45) Date of Patent: Jun. 3, 2025

(54) SEMICONDUCTOR DEVICE AND MANUFACTURING METHOD THEREOF

(71) Applicant: United Microelectronics Corp., Hsinchu (TW)

(72) Inventors: Purakh Raj Verma, Singapore (SG); Ching-Yang Wen, Singapore (SG); Chee-Hau Ng, Singapore (SG); Chin-Wei Ho, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 396 days.

(21) Appl. No.: 17/892,116

(22) Filed: Aug. 21, 2022

(65) Prior Publication Data
US 2024/0038832 A1    Feb. 1, 2024

(30) Foreign Application Priority Data
Aug. 1, 2022  (TW) .................... 111128850

(51) Int. Cl.
*H10D 1/00* (2025.01)
*H01L 23/522* (2006.01)
*H10D 1/68* (2025.01)

(52) U.S. Cl.
CPC ......... *H10D 1/042* (2025.01); *H01L 23/5223* (2013.01); *H10D 1/68* (2025.01); *H10D 1/716* (2025.01)

(58) Field of Classification Search
CPC ............. H01L 28/86–92; H01L 29/945; H01L 29/66181; H01L 27/0805; H01L 27/101; H01L 23/5226; H01L 23/522; H01L 23/5221; H01L 23/528; H01L 23/5283;
(Continued)

(56) References Cited

U.S. PATENT DOCUMENTS

| | | |
|---|---|---|
| 7,317,221 B2 | 1/2008 | Chang et al. |
| 8,487,405 B2 | 7/2013 | Tian et al. |
| 2021/0005393 A1* | 1/2021 | Lu .................... H01G 4/005 |

FOREIGN PATENT DOCUMENTS

| | | | | |
|---|---|---|---|---|
| CN | 114256200 A | * | 3/2022 | |
| DE | 102017220787 A1 | * | 5/2019 | ....... H01L 21/02148 |

OTHER PUBLICATIONS

English Machine Translation DE 102017220787 A1 (Year: 2024).*
English Machine Translation CN 114256200 A (Year: 2024).*

* cited by examiner

*Primary Examiner* — Jose R Diaz
(74) *Attorney, Agent, or Firm* — JCIPRNET

(57) ABSTRACT

A semiconductor device includes a substrate, a high-Q capacitor, an ultra high density capacitor, and an interconnection. At least one trench is formed in the substrate. The high-Q capacitor is disposed on a surface of the substrate, and includes a bottom electrode, an upper electrode located on the bottom electrode, and a first dielectric layer located between the upper and bottom electrodes. The ultra high density capacitor is disposed on the trench of the substrate, and includes a first electrode conformally deposited in the trench, a second electrode located on the first electrode, and a second dielectric layer located between the first and second electrodes. The interconnection connects one of the upper electrode and the bottom electrode to one of the first electrode and the second electrode, and connects the other of the upper electrode and the bottom electrode to the other of the first electrode and the second electrode.

11 Claims, 5 Drawing Sheets

(58) Field of Classification Search
CPC .... H01L 23/5223; H10D 1/042; H10D 1/716; H10D 1/68
See application file for complete search history.

SEMICONDUCTOR DEVICE AND MANUFACTURING METHOD THEREOF

CROSS-REFERENCE TO RELATED APPLICATION

This application claims the priority benefit of Taiwan application serial no. 111128850, filed on Aug. 1, 2022. The entirety of the above-mentioned patent application is hereby incorporated by reference herein and made a part of this specification.

BACKGROUND

Technical Field

The disclosure relates to a semiconductor device and a manufacturing method thereof, and particularly to a semiconductor device including both a high-Q capacitor and an ultra high density capacitor, and a manufacturing method thereof.

Description of Related Art

Due to the high demand for the fifth-generation (5G) mobile communication, a large increase in frequency bands is necessary. Thus, the number of antennas and antenna tuners need to be increased. In order to increase the number of antenna tuners, the number of capacitors packaged in a given area of an antenna module needs to be increased. Therefore, a high density of capacitors per unit area is desired.

Meanwhile, along with an enhanced processing capability of a mobile phone application processor, on-chip power management is necessary. In the on-chip power management, an ultra high density metal-insulator-metal (MIM) capacitor needs to be integrated with a Bipolar-CMOS-DMOS (BCD) technology or processor technology or be bonded with a wafer.

SUMMARY

The disclosure provides a semiconductor device in which a high-Q capacitor and an ultra high density capacitor can be integrated on a chip.

The disclosure further provides a manufacturing method of a semiconductor device, in which a high-Q capacitor and an ultra high density capacitor can be fabricated at the same time on a substrate.

A semiconductor device according to the disclosure includes a substrate, a high-Q capacitor, an ultra high density capacitor, and an interconnection. The substrate has a surface, and at least one trench is formed in the substrate. The high-Q capacitor is disposed on the surface of the substrate, and the high-Q capacitor includes a bottom electrode, an upper electrode located on the bottom electrode, and a first dielectric layer located between the upper electrode and the bottom electrode. The ultra high density capacitor is disposed on the at least one trench of the substrate, and the ultra high density capacitor includes a first electrode conformally deposited in the at least one trench, a second electrode located on the first electrode, and a second dielectric layer located between the first electrode and the second electrode. The interconnection connects one of the upper electrode and the bottom electrode to one of the first electrode and the second electrode, and connects the other of the upper electrode and the bottom electrode to the other of the first electrode and the second electrode.

In an embodiment of the disclosure, the semiconductor device may further include a barrier layer disposed between the surface of the substrate and the bottom electrode and between an inner surface of the at least one trench and the first electrode.

In an embodiment of the disclosure, a projection area of the bottom electrode on the surface of the substrate may be greater than a projection area of the upper electrode on the surface of the substrate.

In an embodiment of the disclosure, a projection area of the first electrode on the substrate may be greater than a projection area of the second electrode on the substrate.

In an embodiment of the disclosure, the interconnection may include multiple vias distributed on the upper electrode, the bottom electrode, the first electrode and the second electrode.

In an embodiment of the disclosure, the interconnection may connect the upper electrode to the second electrode, and may connect the bottom electrode to the first electrode.

In an embodiment of the disclosure, the interconnection may connect the upper electrode to the first electrode, and may connect the bottom electrode to the second electrode.

A manufacturing method of a semiconductor device according to the disclosure includes the following. At least one trench is formed in a substrate. A barrier layer is formed on a surface of the substrate and an inner surface of the at least one trench. A first metal layer is formed on the surface of the substrate and the inner surface of the at least one trench. A dielectric layer is formed on the first metal layer. A second metal layer is formed on the dielectric layer, and the at least one trench is filled. The second metal layer is patterned to form a second electrode over the at least one trench and form an upper electrode on the surface of the substrate. The dielectric layer is patterned to remove the dielectric layer between the second electrode and the upper electrode. The first metal layer is patterned to form a first electrode below the second electrode and form a bottom electrode below the upper electrode.

In another embodiment of the disclosure, before the at least one trench is formed in the substrate, a complementary metal-oxide-semiconductor (CMOS) process may further be performed on the substrate.

In another embodiment of the disclosure, after the CMOS process is performed, an interlayer dielectric (ILD) layer and an intermetal dielectric (IMD) layer may further be formed on the substrate, and the at least one trench may further be formed in the ILD layer, the IMD layer and the substrate.

In another embodiment of the disclosure, after the first metal layer is patterned, an interconnection may further be formed on the upper electrode, the bottom electrode, the first electrode, and the second electrode.

To make the aforementioned more comprehensible, several embodiments accompanied with drawings are described in detail as follows.

DESCRIPTION OF EMBODIMENTS

The disclosure relates to a semiconductor device applied in 5G, in which a high-Q capacitor and an ultra high density capacitor may be integrated on a substrate. Further, by a process design, the same deposition and patterning steps may be used for both an electrode of the high-Q capacitor and an electrode of the ultra high density capacitor. Thus, the high-Q capacitor and the ultra high density capacitor can be integrated on the same substrate with a minimum number of process steps.

The following will describe some embodiments as examples of the disclosure. However, the disclosure is not limited to the embodiments. The embodiments may be combined with each other.

Figure 1:
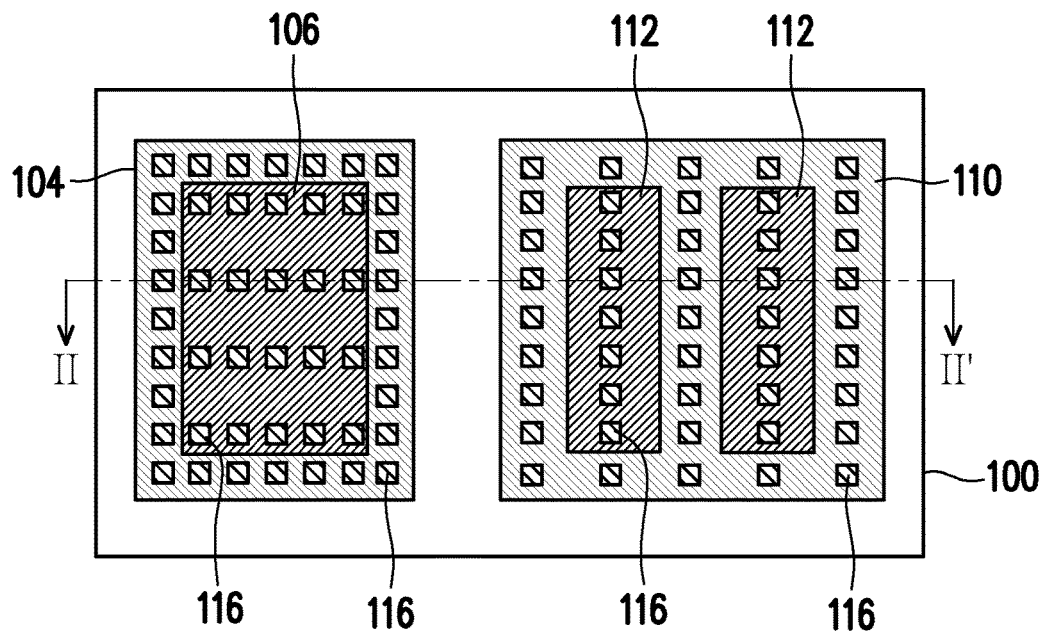
FIG. 1 is a schematic top view of a semiconductor device according to a first embodiment of the disclosure.
Figure 2:
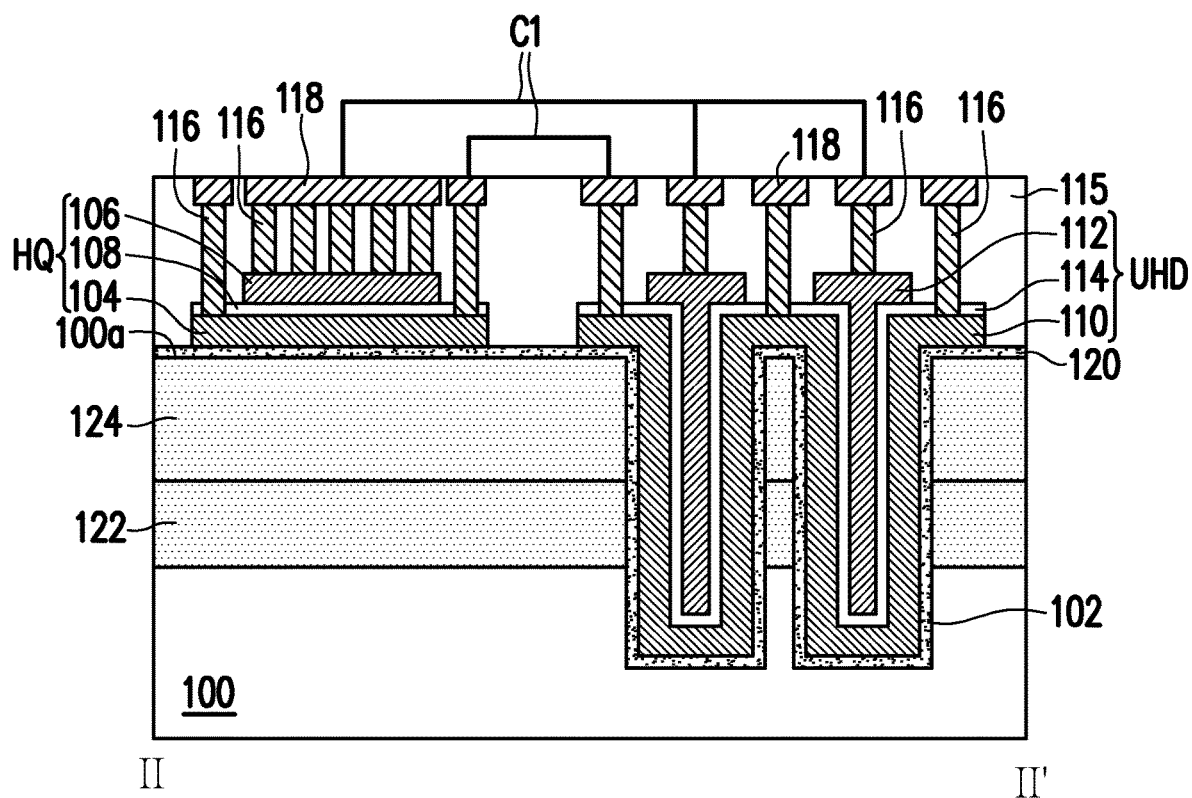
FIG. 2 is a schematic cross-sectional view of the semiconductor device along line II-II' in FIG. 1.

FIG. 1 is a schematic top view of a semiconductor device according to a first embodiment of the disclosure. FIG. 2 is a schematic cross-sectional view of the semiconductor device along line II-II' in FIG. 1.

Referring to FIG. 1 and FIG. 2, the semiconductor device of the first embodiment includes a substrate 100, a high-Q capacitor HQ, an ultra high density capacitor UHD and an interconnection C1. The substrate 100 has a surface 100a, and at least one trench 102 is formed in the substrate 100. The substrate 100 is, for example, a silicon substrate or a dielectric substrate. A depth of the trench 102 is about several micrometers. However, the disclosure is not limited thereto. In FIG. 1, only the substrate 100, an upper electrode 106 and a bottom electrode 104 of the high-Q capacitor HQ, and a first electrode 110 and a second electrode 112 of the ultra high density capacitor UHD in the semiconductor device are labeled, and a via 116 is shown. Please refer to FIG. 2 for a detailed structure.

In FIG. 2, the high-Q capacitor HQ is disposed on the surface 100a of the substrate 100. Since a complementary metal-oxide-semiconductor (CMOS) process and some interconnection processes may be performed on the substrate 100 in advance, the substrate 100 in the first embodiment may be a commonly known semiconductor substrate (such as a silicon substrate), or a film including a dielectric layer (such as an interlayer dielectric (ILD) layer 122 and an intermetal dielectric (IMD) layer 124) above the substrate 100. In the present embodiment, the trench 102 may be formed after M3 (third metal layer). Thus, the trench 102 is located in the ILD layer 122, the IMD layer 124 and the substrate 100. While only two trenches 102 are shown in the present embodiment, it should be understood that the ultra high density capacitor UHD generally includes a large number of trenches 102. Therefore, the number of trenches 102 may be several tens or several hundreds or more.

The high-Q capacitor HQ includes the bottom electrode 104, the upper electrode 106 located on the bottom electrode 104, and a first dielectric layer 108 located between the upper electrode 106 and the bottom electrode 104. A material of the first dielectric layer 108 includes silicon nitride, high-k dielectric or the like. Examples of a material of the bottom electrode 104 include metal, and the bottom electrode 104 may include a multi-layer structure such as a stack of titanium, titanium nitride and aluminum. Examples of a material of the upper electrode 106 include metal, and the upper electrode 106 may include a multi-layer structure such as a stack of titanium, titanium nitride, aluminum, and titanium nitride. The ultra high density capacitor UHD is disposed on the trench 102 of the substrate 100. The ultra high density capacitor UHD includes the first electrode 110 conformally deposited in the trench 102, the second electrode 112 located on the first electrode 110, and a second dielectric layer 114 located between the first electrode 110 and the second electrode 112. A material of the second dielectric layer 114 includes silicon nitride, high-k dielectric or the like. Examples of a material of the first electrode 110 include metal, and the first electrode 110 may include a multi-layer structure such as a stack of titanium, titanium nitride and aluminum. Examples of a material of the second electrode 112 include metal, and the second electrode 112 may include a multi-layer structure such as a stack of titanium, titanium nitride, aluminum, and titanium nitride. Since the upper electrode 106 and the first electrode 110 are made of metal, a barrier layer 120 may be disposed between the surface 100a and the bottom electrode 104 and between an inner surface of the trench 102 and the first electrode 110. Examples of a material of the barrier layer 120 include silicon oxide and silicon nitride.

Referring still to FIG. 2, the first electrode 110 and the bottom electrode 104 may be located at the same level, the first dielectric layer 108 and the second dielectric layer 114 may be located at the same level, and the second electrode 112 and the upper electrode 106 may be located at the same level. Therefore, in view of the manufacturing process, the ultra high density capacitor UHD and the high-Q capacitor HQ may be fabricated together. Accordingly, the manufacturing cost is reduced, and the manufacturing process is compatible with an advanced BEOL process and may be integrated into analog, RF and BCD technologies. The interconnection C1 connects the upper electrode 106 to the second electrode 112 and connects the bottom electrode 104 to the first electrode 110. For example, the interconnection C1 refers to a wire structure formed in a dielectric layer 115 on the substrate 100. The interconnection C1 may include multiple vias 116 distributed on the upper electrode 106, the bottom electrode 104, the first electrode 110 and the second electrode 112, and may further include a conductive layer 118 above the via 116 that is configured to connect to each of multiple vias 116 on the same electrode.

Referring still to FIG. 1, a projection area of the bottom electrode 104 on a surface of the substrate 100 is greater than a projection area of the upper electrode 106 on the surface of the substrate 100. A projection area of the first electrode 110 on the substrate 100 is greater than a projection area of the second electrode 112 on the substrate 100. In the present embodiment, the interconnection C1 connects the upper electrode 106 to the second electrode 112 and connects the bottom electrode 104 to the first electrode 110. In detail, through the via 116 and the conductive layer 118 thereabove, the upper electrode 106 of the high-Q capacitor HQ may be connected to the second electrode 112 of the ultra high density capacitor UHD. Similarly, through the via 116 and the conductive layer 118 thereabove, the bottom electrode 104 of the high-Q capacitor HQ may be connected to the first electrode 110 of the ultra high density capacitor UHD. While the conductive layer 118 is not shown in FIG. 1, it should be understood that the conductive layer 118 may be formed above each of the upper electrode 106, the bottom electrode 104, the first electrode 110 and the second electrode 112, and may be connected to the upper electrode 106, the bottom electrode 104, the first electrode 110 and the second electrode 112 via the via 116. A distribution density of the via 116 above the bottom electrode 104 may be the same as or different from a distribution density of the via 116 above the upper electrode 106. A distribution density of the via 116 above the first electrode 110 may be the same as or different from a distribution density of the via 116 above the second electrode 112. For example, in FIG. 1, the distribution density of the via 116 above the bottom electrode 104 (exposed portion) is different from the distribution density of the via 116 above the upper electrode 106, and the distribution density of the via 116 above the first electrode 110 (exposed portion) is the same as the distribution density of the via 116 above the second electrode 112.

Since the semiconductor device of the first embodiment makes it possible to integrate the high-Q capacitor HQ and the ultra high density capacitor UHD on the same substrate 100, it is suitable for a discrete integrated passive device (IPD).

Figure 3:
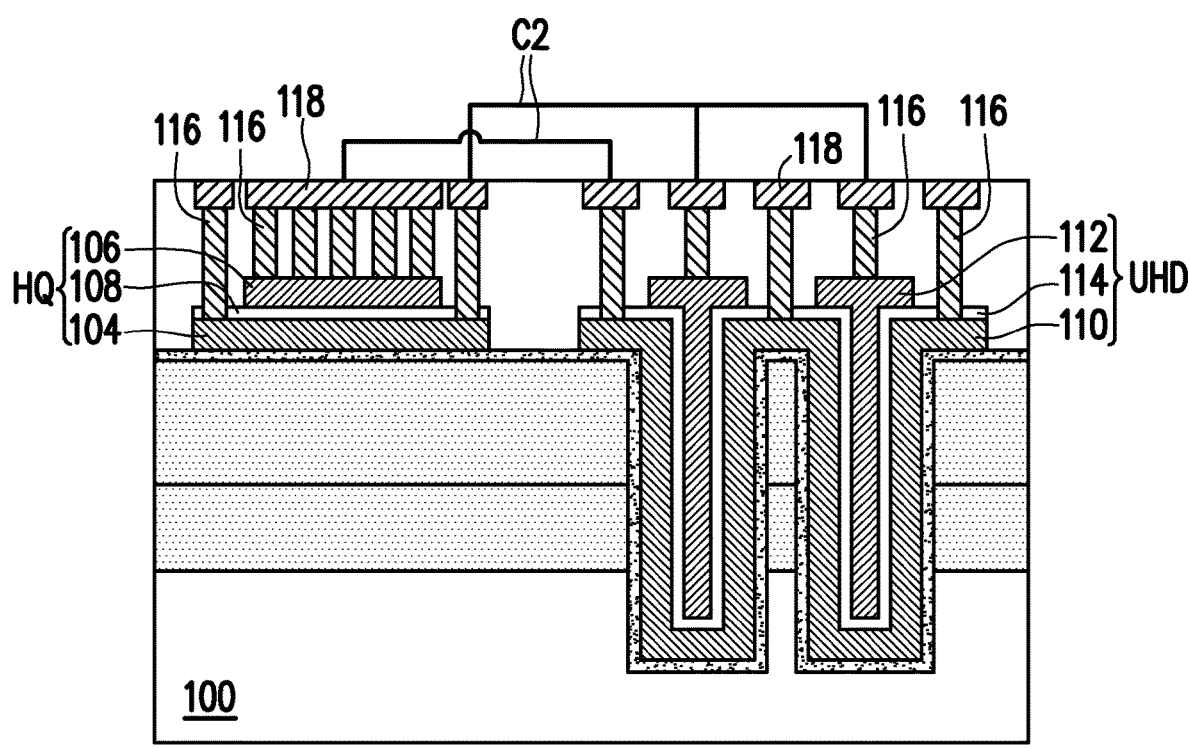
FIG. 3 is a schematic cross-sectional view of a semiconductor device according to a second embodiment of the disclosure.

FIG. 3 is a schematic cross-sectional view of a semiconductor device according to a second embodiment of the disclosure. The same reference numerals as those in the first embodiment denote the same or similar members, and the same or similar members can be understood with reference to the description of the first embodiment and will not be described again.

In FIG. 3, an interconnection C2 connects the upper electrode 106 to the first electrode 110 and connects the bottom electrode 104 to the second electrode 112. In detail, through the via 116 and the conductive layer 118 thereabove, the upper electrode 106 of the high-Q capacitor HQ may be connected to the first electrode 110 of the ultra high density capacitor UHD. Similarly, through the via 116 and the conductive layer 118 thereabove, the bottom electrode 104 of the high-Q capacitor HQ may be connected to the second electrode 112 of the ultra high density capacitor UHD.

FIG. 4A to FIG. 4F are schematic cross-sectional views of a manufacturing process of a semiconductor device according to a third embodiment of the disclosure.

Figure 4A:
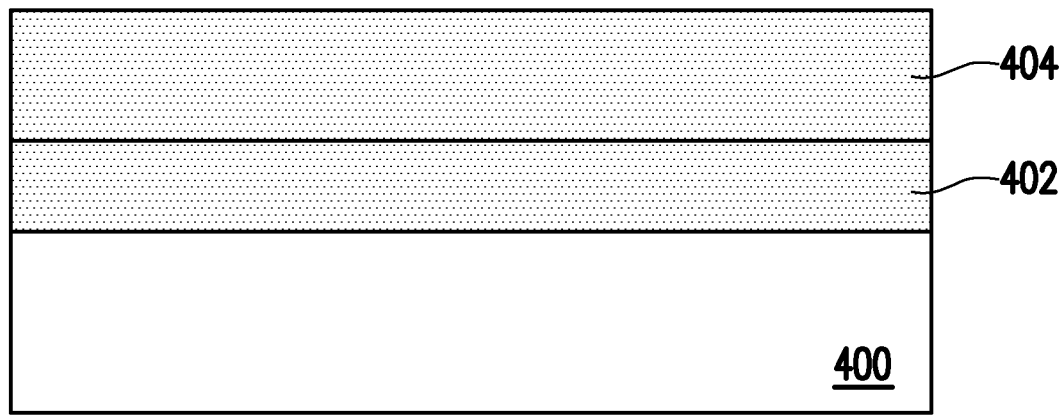
FIG. 4A to FIG. 4F are schematic cross-sectional views of a manufacturing process of a semiconductor device according to a third embodiment of the disclosure.

Referring to FIG. 4A, in a method of the third embodiment, before a trench is formed, a CMOS process may be performed on a substrate 400, and then the trench is formed after M3 (third metal layer). Therefore, after the above CMOS process is performed, an ILD layer 402 and an IMD layer 404 may first be formed on the substrate 400. Although not specifically labeled in FIG. 4A, it should be understood that an interconnection including a first layer of metal and a contact may be formed in the ILD layer 402, an interconnection including a second layer of metal and a via may be formed in the IMD layer 404, and so on.

Figure 4B:
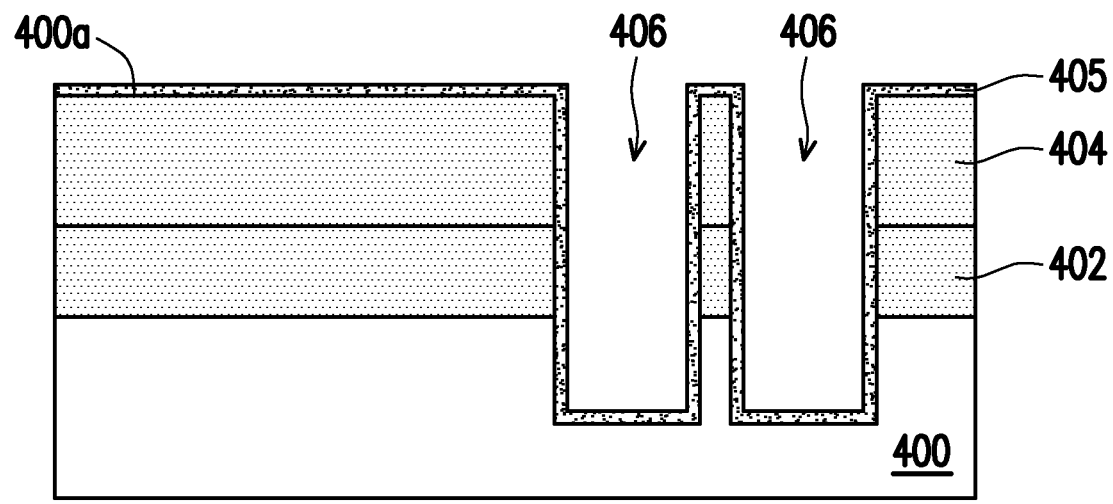

Next, referring to FIG. 4B, a trench 406 is formed in the ILD layer 402, the IMD layer 404 and the substrate 400 by, for example, dry etching. If the ILD layer 402 and the IMD layer 404 are not formed in advance, the trench 406 may be formed directly in the substrate 400. Then, a barrier layer 405 is formed on a surface 400a of the substrate 400 and an inner surface of the trench 406.

Figure 4C:
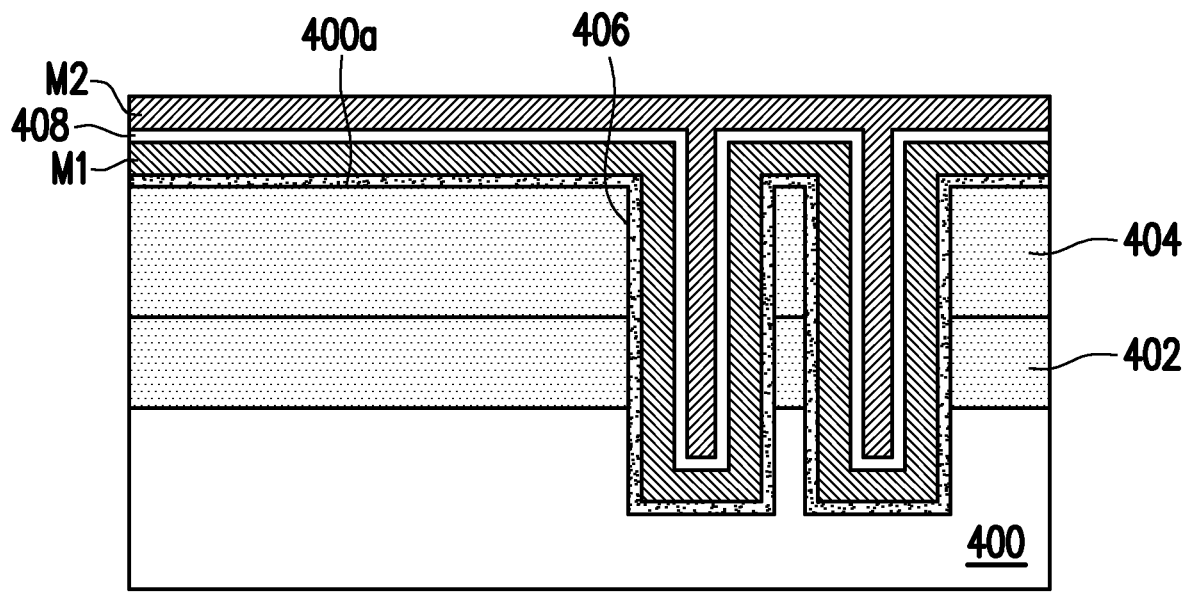

Then, referring to FIG. 4C, a first metal layer M1 is formed on the surface 400a of the substrate 400 and the inner surface of the trench 406, a dielectric layer 408 is formed on the first metal layer M1, and a second metal layer M2 is formed on the dielectric layer 408, and the trench 406 is filled. A method of forming the first metal layer M1 and the second metal layer M2 includes, for example, evaporation or any other suitable deposition method. The first metal layer M1 and the second metal layer M2 may have a multi-layer structure. The first metal layer M1 may be a stack of titanium, titanium nitride and aluminum, and the second metal layer M2 may be a stack of titanium, titanium nitride, aluminum and titanium nitride. Examples of a material of the dielectric layer 408 include silicon nitride and high-k dielectric.

Figure 4D:
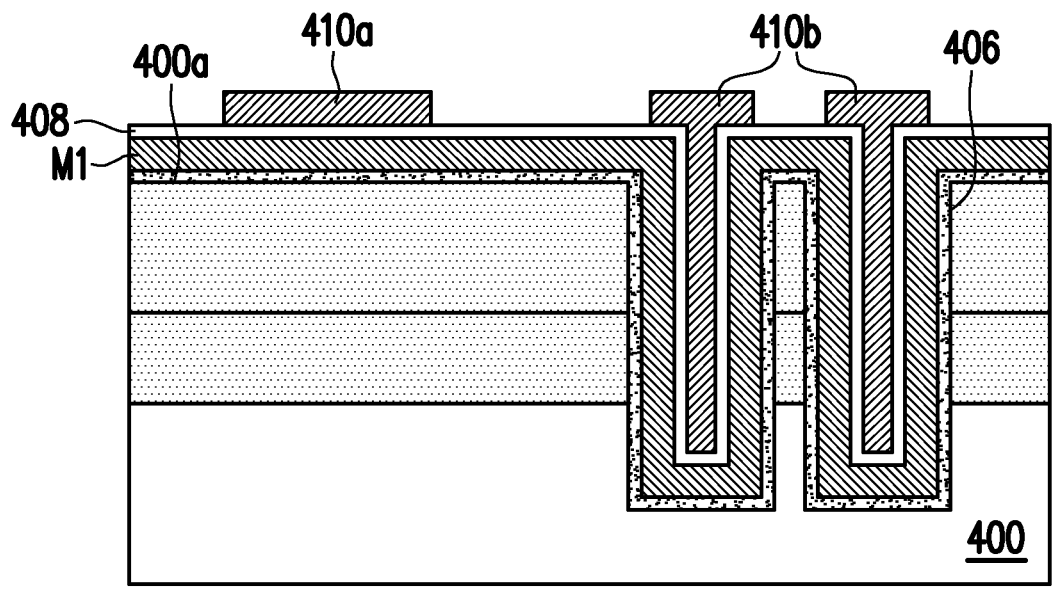

Then, referring to FIG. 4D, the second metal layer (M2) is patterned, so as to form a second electrode 410b over the trench 406 and form an upper electrode 410a on the surface 400a of the substrate 400.

Figure 4E:
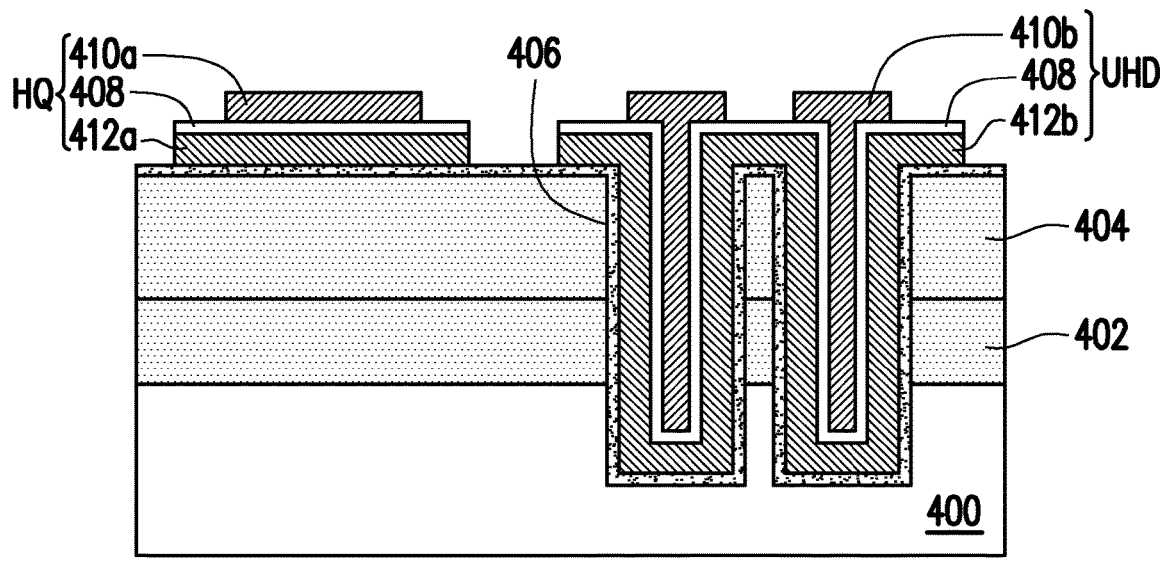

Next, referring to FIG. 4E, the dielectric layer 408 is patterned, so as to remove the dielectric layer 408 between the second electrode 410b and the upper electrode 410a. The first metal layer (M1) is patterned, so as to form a first electrode 412b below the second electrode 410b and form a bottom electrode 412a below the upper electrode 410a. Therefore, through the above steps, the high-Q capacitor HQ including the bottom electrode 412a, the upper electrode 410a and the dielectric layer 408 can be fabricated at the same time as the ultra high density capacitor UHD including the first electrode 412b, the second electrode 410b and the dielectric layer 408.

Figure 4F:
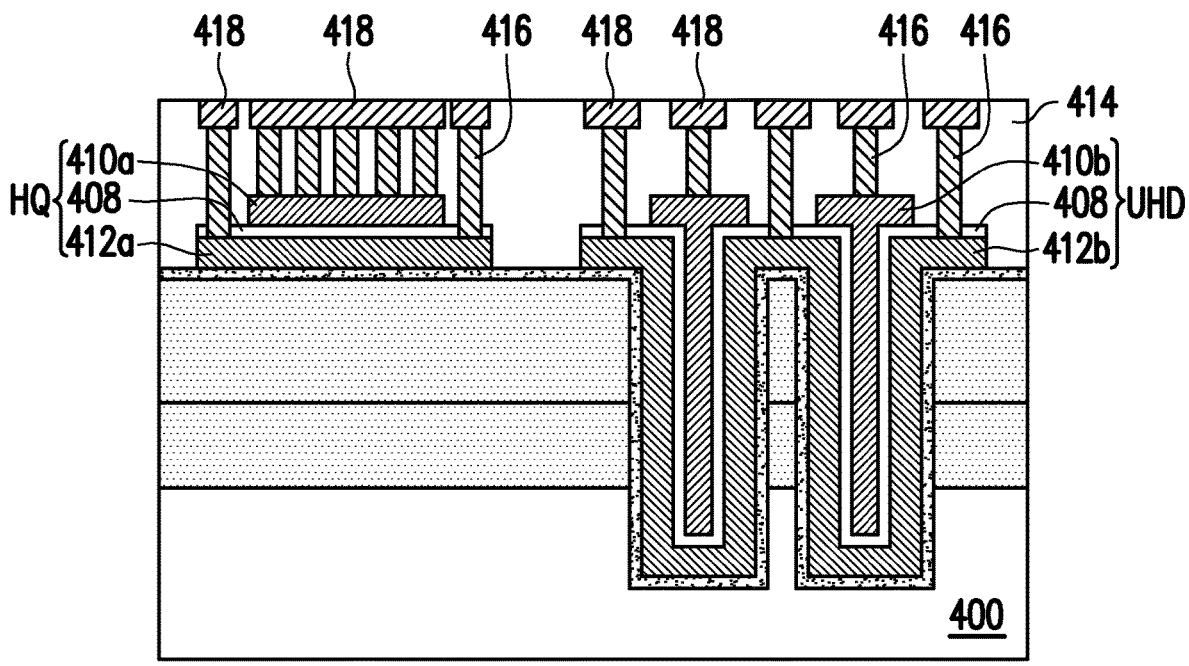

After that, referring to FIG. 4F, an interconnection may be formed on the upper electrode 410a, the bottom electrode 412a, the first electrode 412b and the second electrode 410b, for example, in the following manner. First, a dielectric layer 414 is formed over an entire structure shown in FIG. 4E. Then, multiple vias 416 are formed in the dielectric layer 414 and are respectively connected to the upper electrode 410a, the bottom electrode 412a, the first electrode 412b and the second electrode 410b. Then, a conductive layer 418 connected to the via 416 is formed in the dielectric layer 414.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A semiconductor device, comprising:
   a substrate having a surface, wherein at least one trench is formed in the substrate;
   a high-Q capacitor, disposed on the surface of the substrate, wherein the high-Q capacitor comprises a bottom electrode, an upper electrode located on the bottom electrode, and a first dielectric layer located between the upper electrode and the bottom electrode;
   an ultra high density capacitor, disposed on the at least one trench of the substrate, wherein the ultra high density capacitor comprises a first electrode conformally deposited in the at least one trench, a second electrode located on the first electrode, and a second dielectric layer located between the first electrode and the second electrode; and
   an interconnection, connecting one of the upper electrode and the bottom electrode to one of the first electrode and the second electrode, and connecting the other of the upper electrode and the bottom electrode to the other of the first electrode and the second electrode,
   wherein the bottom electrode and the first electrode are separated from each other.

2. The semiconductor device according to claim 1, further comprising:
   a barrier layer, disposed between the surface of the substrate and the bottom electrode and between an inner surface of the at least one trench and the first electrode.

3. The semiconductor device according to claim 1, wherein
   a projection area of the bottom electrode on the surface of the substrate is greater than a projection area of the upper electrode on the surface of the substrate.

4. The semiconductor device according to claim 1, wherein
a projection area of the first electrode on the substrate is greater than a projection area of the second electrode on the substrate.

5. The semiconductor device according to claim 1, wherein
the interconnection comprises a plurality of vias distributed on the upper electrode, the bottom electrode, the first electrode and the second electrode.

6. The semiconductor device according to claim 1, wherein
the interconnection connects the upper electrode to the second electrode, and connects the bottom electrode to the first electrode.

7. The semiconductor device according to claim 1, wherein
the interconnection connects the upper electrode to the first electrode, and connects the bottom electrode to the second electrode.

8. A manufacturing method of a semiconductor device, comprising:
forming at least one trench in a substrate;
forming a barrier layer on a surface of the substrate and an inner surface of the at least one trench;
forming a first metal layer on the surface of the substrate and the inner surface of the at least one trench;
forming a dielectric layer on the first metal layer;
forming a second metal layer on the dielectric layer, and filling the at least one trench;
after forming the barrier layer, the first metal layer, the dielectric layer and the second metal layer, patterning the second metal layer to form a second electrode over the at least one trench and form an upper electrode on the surface of the substrate;
after patterning the second metal layer, patterning the dielectric layer to remove the dielectric layer between the second electrode and the upper electrode; and
after patterning the dielectric layer, patterning the first metal layer to form a first electrode below the second electrode and form a bottom electrode below the upper electrode.

9. The manufacturing method of a semiconductor device according to claim 8, further comprising, before forming the at least one trench in the substrate:
performing a complementary metal-oxide-semiconductor process on the substrate.

10. The manufacturing method of a semiconductor device according to claim 9, further comprising, after performing the complementary metal-oxide-semiconductor process:
forming an interlayer dielectric layer and an intermetal dielectric layer on the substrate, and forming the at least one trench in the interlayer dielectric layer, the intermetal dielectric layer and the substrate.

11. The manufacturing method of a semiconductor device according to claim 8, further comprising, after patterning the first metal layer:
forming an interconnection on the upper electrode, the bottom electrode, the first electrode, and the second electrode.

* * * * *